(12) United States Patent
Miyake

(10) Patent No.: US 6,603,107 B2
(45) Date of Patent: Aug. 5, 2003

(54) IMAGE PICKUP DEVICE AND PORTABLE TELEPHONE

(75) Inventor: Hiroyuki Miyake, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/828,229

(22) Filed: Apr. 9, 2001

(65) Prior Publication Data

US 2001/0027873 A1 Oct. 11, 2001

(30) Foreign Application Priority Data

Apr. 10, 2000 (JP) ....................................... 2000-107762

(51) Int. Cl.[7] ............................................. H01L 27/00
(52) U.S. Cl. ..................... 250/208.1; 250/239; 257/672; 349/199
(58) Field of Search ........................... 250/208.1, 214.1, 250/214 R, 239, 216; 358/483, 482; 257/672, 676, 680, 684, 783, 786; 361/820; 455/566, 556, 557, 575; 349/199, 193

(56) References Cited

U.S. PATENT DOCUMENTS

| 5,783,463 A | * | 7/1998 | Takehashi et al. | .......... 438/112 |
| 5,962,842 A | * | 10/1999 | Kimura | .................... 250/208.1 |
| 6,243,155 B1 | * | 6/2001 | Zhang et al. | ................ 349/199 |

* cited by examiner

Primary Examiner—Kevin Pyo
Assistant Examiner—Seung C. Sohn
(74) Attorney, Agent, or Firm—Oblon, Spivak, McClelland, Maier & Neustadt, P.C.

(57) ABSTRACT

An image pickup device and a portable telephone reduced in planar dimension and thickness are provided. The image pickup device includes a circuit board provided with an opening portion and having an interconnection pattern formed of interconnections and an interface region disposed therein, and an image pickup element placed on the circuit board and having a light receiving portion. The interconnection pattern is placed in an outer frame portion on the lateral side of the opening portion, together with land portions as terminals of the respective interconnections, and extends to reach the interface region. At least one of the interconnections is placed between the land portions and the opening portion.

19 Claims, 14 Drawing Sheets

E1 PORTION

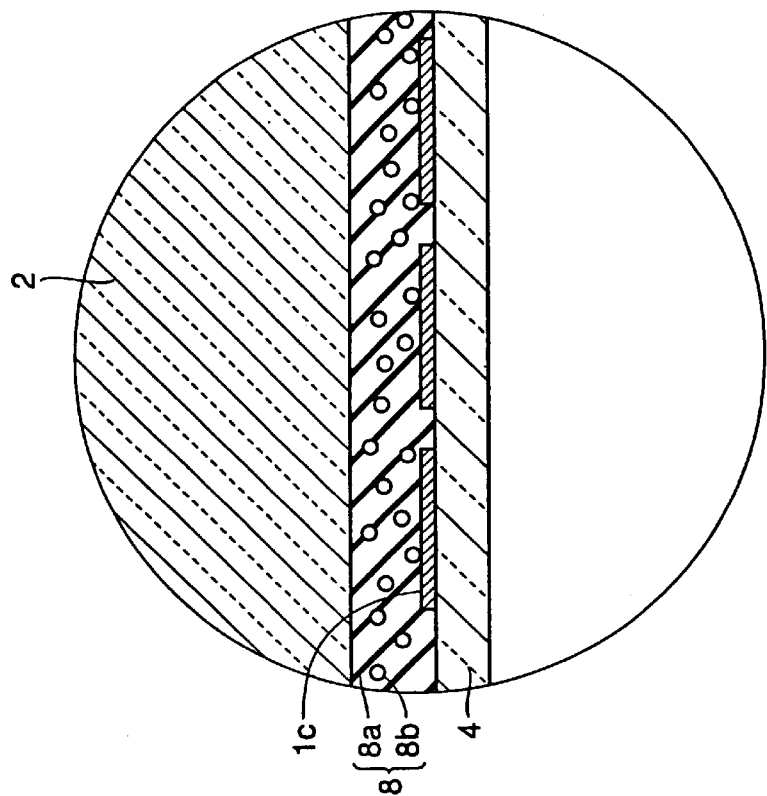
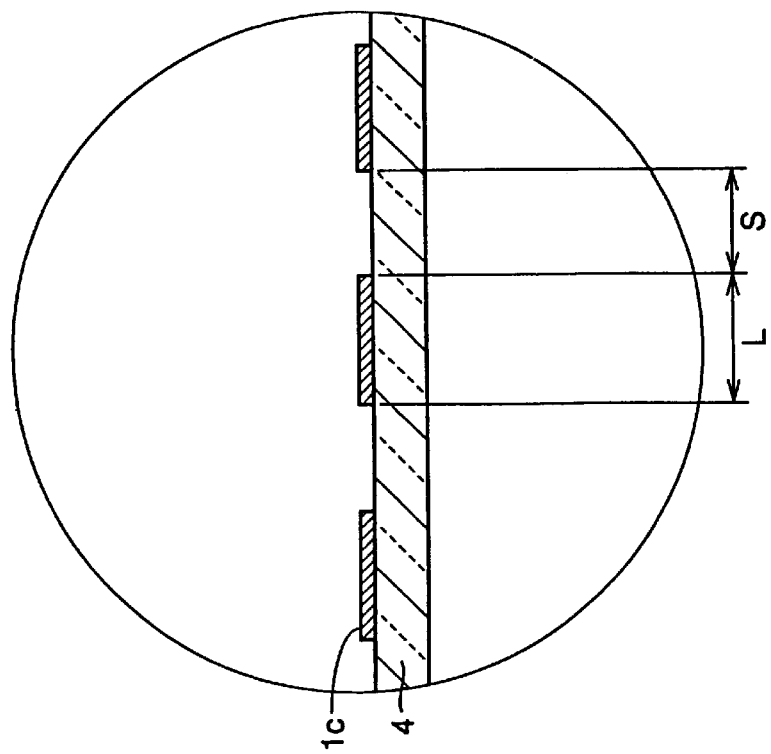

IMAGE PICKUP DEVICE AND PORTABLE TELEPHONE

BACKGROUND OF THE INVENTION

1. Field of the Invention

The present invention relates to image pickup devices for converting visual information to electrical signals and further reproducing the same as images, and portable telephones provided with such image pickup devices. More particularly, the present invention relates to an image pickup device and a portable telephone both downsized.

2. Description of the Background Art

FIG. 18 shows a schematic configuration of a conventional image pickup device. Referring to FIG. 18, an image pickup element 102 is mounted on the surface of a circuit board 101 by die bonding. An input/output terminal 117 of the image pickup element and a land portion 119 being a terminal of an interconnection pattern on the circuit board are connected by a wire 118 by wire bonding. In this image pickup device, optical information from an imaging lens, not shown, passes through a transparent plate 103 and is received at a light receiving plate 102a provided in image pickup element 102, and converted to an electrical signal. This electrical signal is sent from input/output terminal 117, through wire 118 to land portion 119, and to an interface portion (not shown). The transparent plate 103 is provided to seal light receiving plate 102a to prevent airborne dust from adhering thereto. Such a conventional image pickup device is too large in two dimensions and too thick to be mounted on a portable terminal device or the like.

An image pickup device reduced in planar dimension and thickness to improve light receiving efficiency is proposed (in Japanese Patent Laying-Open No. 9-199701), which has an image pickup element mounted on a mounting board with an opening and solely a light receiving area (an optical detection area) hermetically sealed. In this image pickup device, as shown in FIGS. 19A and 19B, the mounting board 101 is provided with an opening 101a that is formed so as not to interfere an optical path to light receiving plate 102a, and the image pickup element 102 is bonded face down. A terminal 119 of an interconnection pattern 101c of mounting board 101 and a bump 117 formed on a bonding pad of the image pickup element are aligned and bonded with each other. In this image pickup device, light receiving plate 102a is sealed by a transparent plate 103 and a sealing resin 121. In addition, the opening 101a on the mounting board is made sufficiently large with respect to the light receiving plate of the image pickup element, taking processing accuracy into consideration, so as not to interfere the reception of the light. Compared to the configuration as describe above, this image pickup device provides for a compact structure with reduced thickness and planar dimension.

The connection applying wire bonding as described above, however, increases the circuit board area in all directions. Moreover, the interconnection pattern in the image pickup device disclosed in Japanese Patent Laying-Open No. 9-199701 is placed to extend perpendicular to the edge of the opening, which hinders downsizing in the width direction. More specifically, as shown in FIG. 19A, the interconnection 101c of the circuit board is placed perpendicular to the edge of the opening 101a, and extends from the end portion 117 towards the outer shape of the image pickup element. Thus, the outer shape of the circuit board has a planar dimension greater than that of the image pickup element, thereby suppressing downsizing of the image pickup device.

Another image pickup device is disclosed (in Japanese Patent Laying-Open No. 5-260393), which has interconnections routed along the edges of the opening of the circuit board for the purposes of decreasing the planar dimension. In this device, however, the interconnection pattern is routed along the entire periphery of the opening. Thus, the effect to reduce the planar dimension was insufficient. To meet the stringent demands for downsized portable terminals of these days, a further decrease in planar dimension is required.

The configuration to mount an element on a circuit board face down, as described above, is well known in packaging of semiconductor elements, regardless of the type of the circuit board. As a circuit board for mounting the semiconductor elements therein, PCB (Print Circuit Board) of glass epoxy type, and FPC (Flexible Print Circuit) of a film shape, for example, are well known. However, an image pickup device that employs a film circuit board having an opening to let light pass therethrough as a circuit board for mounting an image pickup element face down thereon has not been known.

SUMMARY OF THE INVENTION

An object of the present invention is to provide an image pickup device and a portable telephone that are decreased in planar dimension and thickness.

The image pickup device according to a first aspect of the present invention includes: a circuit board provided with an opening portion and having an interconnection pattern formed of a plurality of interconnections and an interface region disposed therein; and an image pickup element placed on the circuit board and having a light receiving portion for receiving light from an imaging lens through the opening portion. The interconnection pattern is placed in an outer frame portion on a lateral side of the opening portion, together with a plurality of land portions being terminals of the respective interconnections, and extends to the interface region. At least one of the plurality of interconnections is placed between the land portions and the opening portion.

With the configuration as described above, it becomes possible to place the interconnection pattern in the outer frame portion surrounding the opening portion, not perpendicular to, but along the edge of the opening portion. Accordingly, the width of the outer frame portion of the opening portion can be reduced. Further, by disposing the interconnection pattern and the land portions (terminals of the interconnection pattern) that would take a relatively large space collectively in the outer frame portion on the same lateral side, the interconnection pattern can be placed compactly, without a need to route the same around the opening portion. The interconnection pattern may be placed exclusively between the land portions and the opening portion. Alternatively, a part of the interconnection pattern may be placed on the outer side of the land portions.

Herein, the "lateral side" of the opening portion refers to lateral or side portions thereof, when the circuit board is seen from its front surface side in an elevation view wherein the circuit board is arranged longer than is wide with an interface region being provided on an upper side or a lower side of the opening portion. The lateral side may include either or both of the left and right side portions. With the configuration as described above, it is possible to leave the outer frame portion on either upper or lower side of the opening portion, without placing the interconnection pattern therein. For example, in the configuration where the outer frame portion having such an empty space is to be provided on the upper side of the opening portion, a region for the interface portion is provided on the lower side of the opening portion. If the outer frame portion with an empty space is to be provided on the lower side of the opening portion, the interface region is provided on the upper side thereof. Thus, it becomes possible to minimize the frame width of the outer frame portion on either the upper or the lower side of the opening portion where the interconnection pattern is not being placed, and the interconnection pattern can be placed compactly. As a result, the region of the circuit board in which the image pickup element is to be mounted can be made small, thus enabling downsizing of the image pickup device. Throughout the specification, the "back side" refers to the side of the circuit board on which the image pickup device is being mounted, and the "front side" refers to the side of the circuit board on which the transparent plate is being mounted. The "front surface" of each element refers to a surface of the element on the same side as the front side, and the "back surface" of each element refers to its surface on the same side as the back side.

In the image pickup device according to the first aspect, all of the plurality of interconnections may be placed between the land portions and the opening portion. The interconnection pattern is placed in the outer frame portion within a region overlapping the image pickup element when seen in two dimensions.

With such a configuration, the mounting region of the image pickup element in the circuit board is utilized effectively by placing the interconnection pattern in the outer frame portion to overlap the image pickup element when seen in two dimensions. Thus, compared to the case where the interconnection pattern is placed in a region not overlapping the image pickup element, the size of the image pickup device can be reduced. As the image pickup element, a solid-state image pickup element CCD (Charge Coupled Device), a CMOS (Complementary Metal Oxide Semiconductor) transistor or the like is employed. Accordingly, it becomes possible to downsize the image pickup element mounting region in the image pickup device to a maximum possible level of downsizing of the image pickup element, and to place the interconnection pattern in this image pickup element mounting region without expanding the region.

In the image pickup device according to the first aspect, each interconnection may include a first portion extending from the land portion towards the opening portion in a direction intersecting an edge of the lateral side of the opening portion, and a second portion extending continuously from an end of the first portion towards the interface region along the edge of the lateral side of the opening portion.

With such a configuration, it becomes possible to arrange the land portions each having a relatively large area in a line along the longitudinal direction of the outer frame portion, and to place the interconnections extending from the respective land portions along the edge of the opening portion at different distances from the opening portion successively. Accordingly, the interconnection pattern including the land portions can be placed in the outer frame portion in a very compact manner, so that the width of the outer frame portion can be reduced.

The image pickup device of the first aspect may further be provided with an adhesive agent between the circuit board and the image pickup element for adhesion thereof. The adhesive agent ensures conduction between the land portion on the circuit board and a corresponding bump on the input/output terminal of the image pickup element and isolation between the other portions.

When mounting the image pickup element on the circuit board, the land portion being a terminal of the interconnection pattern on the circuit board and a corresponding bump provided on the input/output terminal of the image pickup element are electrically connected to each other. Conventionally, an insulating layer having an opening corresponding to the land portions and bumps has normally been deposited on the mounting side of the circuit board, so as to prevent conduction between a bump and an interconnection that should not be connected to that bump or to prevent interconnections from being short-circuited with each other. The opening and an outer shape of the insulating layer are processed by blanking, and this blanking process and placement of the insulating layer are limited in accuracy to some extent. Therefore, in order to ensure desired connections between the bumps and the land portions even if variations would occur in the blanking and placing processes, the interconnection pattern including the land portions could not be downsized to an optimum level. More specifically, a minimum distance between the land portion in the interconnection pattern and the portion of the interconnection extending along the edge of the opening portion had to be made greater than a prescribed value. According to the present invention, however, the insulating layer is eliminated in the image pickup element mounting region, and the adhesive agent is employed instead. Accordingly, it is possible to reduce the minimum distance between the land portion and the portion of the interconnection extending along the edge of the opening, without the limitations as described above. As a result, the width of the outer frame portion surrounding the opening portion can further be narrowed, and thus, the image pickup device can further be downsized.

In the image pickup device of the first aspect, the adhesive agent may be an anisotropic conductive film (ACF) with conductive fillers distributed within a resin as an insulating binder. Thus, in a portion of the anisotropic conductive film where the resin is left aside as the land portion and the bump are close to each other, one or a plurality of the conductive fillers existing between the land portion and the bump can achieve conduction therebetween. In the other portions, the conductive fillers are distributed within the resin to maintain insulation.

By the use of the ACF above, it becomes unnecessary to dispose an insulating layer with an opening in the image pickup element mounting region. The ACF serves to reliably connect the land portion and the corresponding bump and to inhibit connection between the other portions.

In the image pickup device of the first aspect, minimum distances between the neighboring interconnections, between the neighboring land portions, and between the neighboring interconnection and land portion in the circuit board are each preferably at least 0.020 mm. A diameter of the granular conductive filler is preferably less than 0.010 mm.

With such a configuration, as long as the granular conductive fillers are separated from one another, it is possible to prevent short circuit between the portions that should not be connected to each other. By using such conductive fillers, conduction between the bumps and land portions as well as isolation between the other portions can be ensured without provision of the insulating layer in the mounting region. As a result, the minimum distance between the land portion and the interconnection can be reduced, and the outer frame portion where the interconnection pattern is being disposed can be narrowed. This enables further downsizing in planar dimension.

In the image pickup device of the first aspect, the circuit board may be a flexible, film circuit board.

By using the film circuit board to implement the circuit board described above, it becomes possible to further reduce planar dimension and thickness. When the film circuit board having the image pickup element and others bonded thereto is mounted on a product, it is slightly flexed or undulated to afford a certain margin or is loosely folded. Thus, the degree of freedom in placement of a connector portion of the product, e.g., a portable telephone, can be increased, and a space of the product being occupied by the image pickup device mounted thereon can be considerably decreased. The circuit board itself can also be reduced in weight.

The image pickup device according to a second aspect of the present invention includes an image pickup element that is mounted on a circuit board having an interconnection pattern formed of a plurality of interconnections disposed therein. The circuit board is provided with an opening portion, and includes a first region having an outside size that is approximately equal to or smaller than an outside size of the image pickup element and a second region having an interface region therein. The image pickup element is fixed in the first region such that a light receiving plane for receiving light faces with the opening portion. The interconnection pattern is formed on the first region in an outer frame portion on a lateral side of the opening portion and extends to the second region to electrically connect the image pickup element to the interface region in the second region.

With such a configuration, the outer frame portion of the opening portion can be effectively utilized by placing therein the interconnection pattern through which signals from the image pickup element are transmitted. In addition, the area of the interconnection pattern is restricted within the outside size of the image pickup element, and accordingly, the area of the outer frame portion is restricted to a small size.

In the image pickup device according to the second aspect, the circuit board includes a plurality of land portions being terminals of the respective interconnections that are arranged along a lateral edge of the opening portion. The interconnection pattern is formed in the outer frame portion of the lateral side of the opening portion, in a region between the land portions and the opening portion, and extends in a direction along which the plurality of land portions are arranged.

With the configuration as described above, by disposing the interconnection pattern and the land portions (terminals of the interconnection pattern) that would take a relatively large space collectively in the outer frame portion on the same lateral side, the interconnection pattern can be placed compactly, without a need to route the same around the opening portion. In addition, it is possible to leave the outer frame portion on either upper or lower side of the opening portion, without placing the interconnection pattern therein. For example, in the configuration where the outer frame portion having such an empty space is to be provided on the upper side of the opening portion, a region for interface portion is provided on the lower side of the opening portion. If the outer frame portion with an empty space is to be provided on the lower side of the opening portion, the interface region is provided on the upper side thereof. Thus, it becomes possible to minimize the frame width of the outer frame portion on either the upper or the lower side of the opening portion where the interconnection pattern is not being placed, and the interconnection pattern can be placed compactly. As a result, the region of the circuit board in which the image pickup element is to be mounted can be made small, thus enabling downsizing of the image pickup device.

The image pickup device according to a third aspect of the present invention includes: a flexible, film circuit board provided with an opening portion and having an interconnection pattern disposed on its back surface side; and an image pickup element mounted face down on the back surface of the film circuit board and having a light receiving portion for receiving light from an imaging lens through the opening portion.

With such a configuration, the image pickup device can further be reduced in thickness. The film circuit board with the image pickup element and others bonded thereto is slightly flexed or undulated to afford a margin or loosely folded when it is mounted on a product. Therefore, the degree of freedom in placing a connector portion of a portable telephone or the like is increased, and a space of the product being occupied by the image pickup device mounted thereon is considerably decreased. The circuit board is also reduced in weight.

In the image pickup device according to the third aspect, the film circuit board preferably has a thickness in a range between 0.020 mm and 0.050 mm.

By setting the thickness of the film circuit board within the range above, it is possible to quantitatively promote the reduction in thickness of the image pickup device.

In the image pickup device according to the third aspect, the opening portion of the film circuit board is preferably sealed by a transparent plate.

Provision of such a transparent plate adds rigidity to the film circuit board, which prevents it from undesirably curving, thereby allowing it to maintain a flat plate shape. Accordingly, easy handling of the film circuit board upon manufacturing is guaranteed.

In the image pickup device of the third aspect, a thickness T (TOTAL) from the back surface of the image pickup element to the front surface of the transparent plate is preferably not greater than 1.20 mm.

With such a total thickness T (TOTAL), it is possible to control and further promote the reduction in thickness.

In the image pickup device of the third aspect, the transparent plate is attached by adhesive means to either one of the film circuit board and the image pickup element. The adhesive means may include means for maintaining at least a prescribed distance between the transparent plate and the image pickup element.

With such a configuration, even if a thin film circuit board is used as the circuit board, it is possible to keep at least a prescribed distance from the transparent plate through the opening portion to the light receiving portion by simple means, thereby allowing formation of a good image.

In the image pickup device of the third aspect, spacer materials are preferably included in the adhesive agent for attachment of the transparent plate to the film circuit board.

By uniformly placing the spacer materials, it is possible to ensure at least a prescribed value of the thickness T (CLEARANCE) from the front surface of image pickup element to the back surface of transparent plate with a high degree of accuracy. This also has an effect to restrict deviation from parallelism of a relation between the front surface of image pickup element and the back surface of transparent plate within, e.g., 0.2 degrees.

In the image pickup device of the third aspect, the film circuit board may further be provided with a second opening portion, through which a thixotropic adhesive agent is disposed to attach the transparent plate to the image pickup element.

The thixotropic adhesive agent is an adhesive agent of high viscosity that is unlikely to deform or decay until it is cured or hardened. Provision of the thixotropic adhesive agent facilitates securement of the thickness T (CLEARANCE) of at least a prescribe value from the front surface of image pickup element to the back surface of transparent plate.

The image pickup device of the first aspect may be mounted on a portable telephone such that light from the outside of the casing of the portable telephone passes through the imaging lens and is received at the light receiving portion.

By mounting the image pickup device described above on the portable telephone, it becomes possible to downsize and lessen the weight of the portable telephone that is capable of transmitting an image of a good quality level for display.

The image pickup device of the first aspect mounted on the portable telephone may further be provided with at least one of a rubber connector and a peripheral circuit element. The circuit board is a flexible, film circuit board, and the film circuit board is folded such that a surface of at least one of the rubber connector and the peripheral circuit element contacts a back surface of the image pickup element, directly or indirectly with the film circuit board interposed therebetween.

With the use of the rubber connector above, provision of a molding connector or the like becomes unnecessary, so that a manufacturing cost can be reduced. Since the film circuit board is folded in two before being mounted on a product, a space of the product being occupied by the image pickup device is considerably decreased. The elasticity of the rubber connector provides a shock-absorbing effect against shock loading. The degree of freedom in designing the film circuit board can also be increased. Further, in the image pickup device requiring provision of the peripheral circuit element, the image pickup device and the peripheral circuit element can be stacked one on the other, so that a mounting area of the image pickup device on a product can be reduced, thereby enabling space saving.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are cross sectional views taken along the line VI—VI shown in FIG. 5B, without and with the ACF and others, respectively.

DESCRIPTION OF THE PREFERRED EMBODIMENTS

Hereinafter, embodiments of the present invention will be described with reference to the drawings.

First Embodiment

Figure 1A:
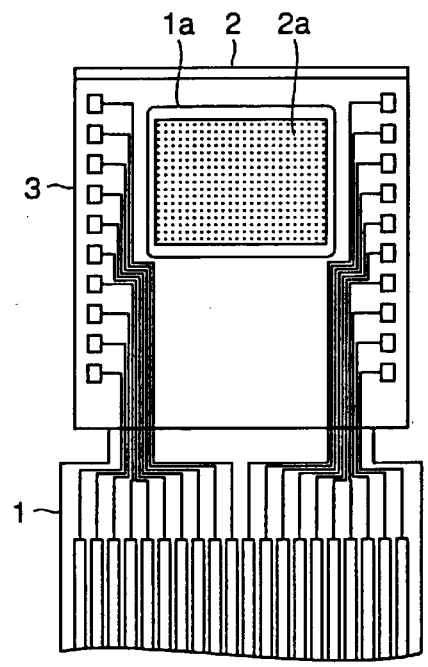
FIG. 1A is a schematic front view of an image pickup device according to a first embodiment of the present invention, with a transparent plate being fixed on a front surface of a film circuit board and an image pickup element being mounted on a back surface of the film circuit board.
Figure 1B:
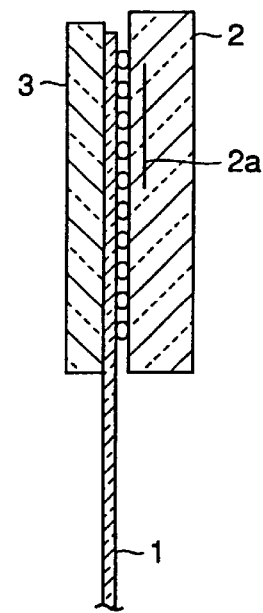
FIG. 1B is a vertical cross sectional view thereof.

FIGS. 1A and 1B show a compact image pickup device for use in a portable telephone according to the first embodiment of the present invention. FIG. 1A is a schematic diagram showing a front view of the image pickup device, with a transparent plate placed on a front side and an image pickup element placed on a back side of a film circuit board, and FIG. 1B is a vertical cross sectional view thereof. Referring to FIGS. 1A and 1B, the film circuit board 1 is provided with an opening 1a. The image pickup element 2 is mounted face down on the back side of film circuit board 1, covering the opening 1a. Transparent plate 3 is provided on the front side of film circuit board 1, again covering opening 1a. Light emitted from an imaging lens (not shown) passes through transparent plate 3 and opening 1a to reach a light receiving plate 2a provided in image pickup element 2. Opening 1a is formed into a shape that corresponds to the shape of this light receiving plate 2a.

Image pickup element 2 is mounted face down on film circuit board 1 by FCB (flip chip bonding), while light receiving plate 2a being positioned to oppose the opening 1a with a high degree of accuracy. Transparent plate 3 is bonded to film circuit board 1 by an adhesive agent, for example, so that they are integrated with each other. In FIGS. 1A and 1B, bumps for use in mounting of image pickup element 2, an anisotropic conductive film (ACF) and the adhesive agent for transparent plate 3 are not illustrated.

Figure 2A:
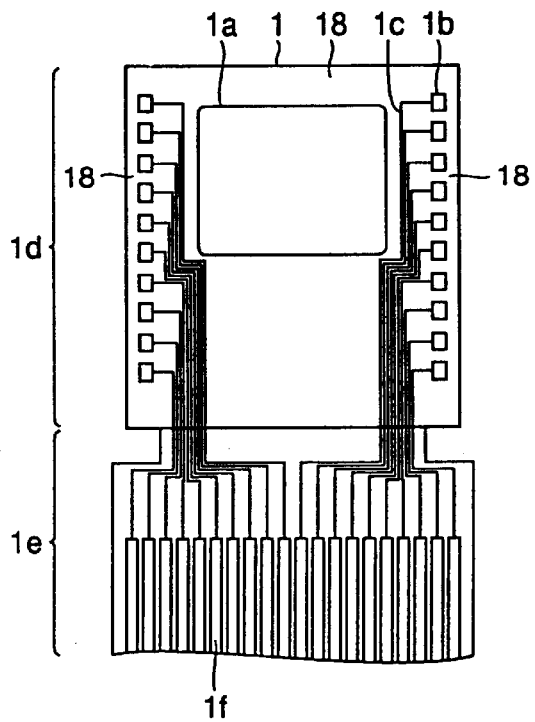
FIG. 2A is a front view of the film circuit board shown in FIGS. 1A and 1B when seen from its back side.
Figure 2B:
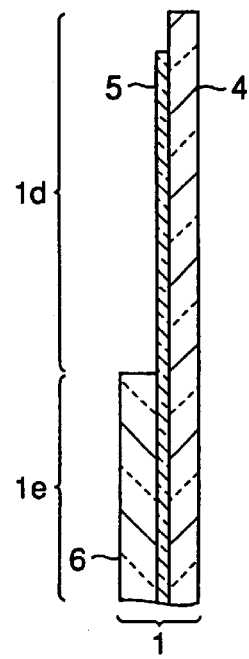
FIG. 2B is a vertical cross sectional view thereof.

FIG. 2A shows the back side of the film circuit board on which the image pickup element is to be mounted face down, and FIG. 2B shows a vertical cross section thereof. Referring to FIGS. 2A and 2B, an insulating layer 6 is not deposited in a region 1d where image pickup element 2 is to be mounted. Conventionally, for connection between input/output terminals of the image pickup element and terminals (land portions) of the film circuit board, an insulating layer having an opening only in the portion corresponding to the land portions has been provided to prevent short circuit in portions other than the land portions. Placement of such a conventional insulating layer, however, restricts the shape of a circuit pattern, from the standpoint of processing accuracy of the opening in the insulating layer or the like, which makes it difficult to narrow the width of an outer frame portion 18 of the film circuit board, and hence, to narrow the entire width. Thus, in the present embodiment, as shown in FIG. 2B, the insulating layer is removed from the side of region 1d on which the image pickup element is to be mounted. More specifically, film circuit board 1 in this mounting region 1d consists only of a base film 4 and a conductor layer 5 that is exposed to the side for mounting of the image pickup element. Film circuit board 1 in a region if where the image pickup element is not mounted constitutes an interface portion. This interface portion if corresponds to a region 1e covered by insulating layer 6. Such removal of the insulating layer will not make the cross section thickness of mounting region 1d too thin. Rather, it allows reduction in planar dimension of the region.

Figure 3A:
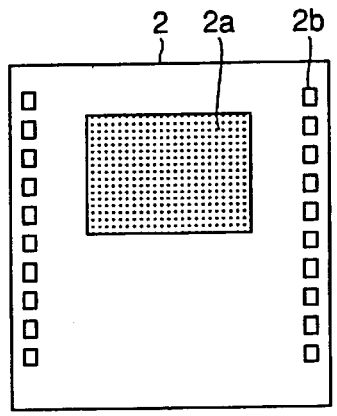
FIG. 3A is a front view of the image pickup element shown in FIGS. 1A and 1B.
Figure 3B:
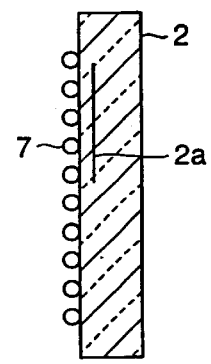
FIG. 3B is a vertical cross sectional view thereof

FIGS. 3A and 3B show details of image pickup element 2 of the present embodiment. FIG. 3A is a front view of the image pickup element, showing its surface to be bonded face down, and FIG. 3B is a vertical cross sectional view thereof. Referring to FIG. 3B, bumps 7 are shown on the side to be bonded face down, which are formed on input/output terminals of the image pickup element. Each bump 7 is to be connected to a respective land portion of a circuit pattern that is formed in the film circuit board.

Figure 4A:
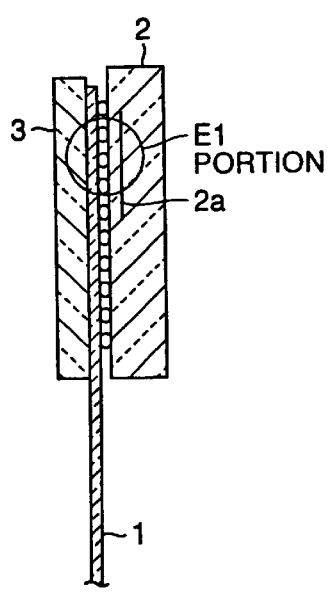
FIG. 4A is a cross sectional view of the image pickup device of the first embodiment.
Figure 4B:
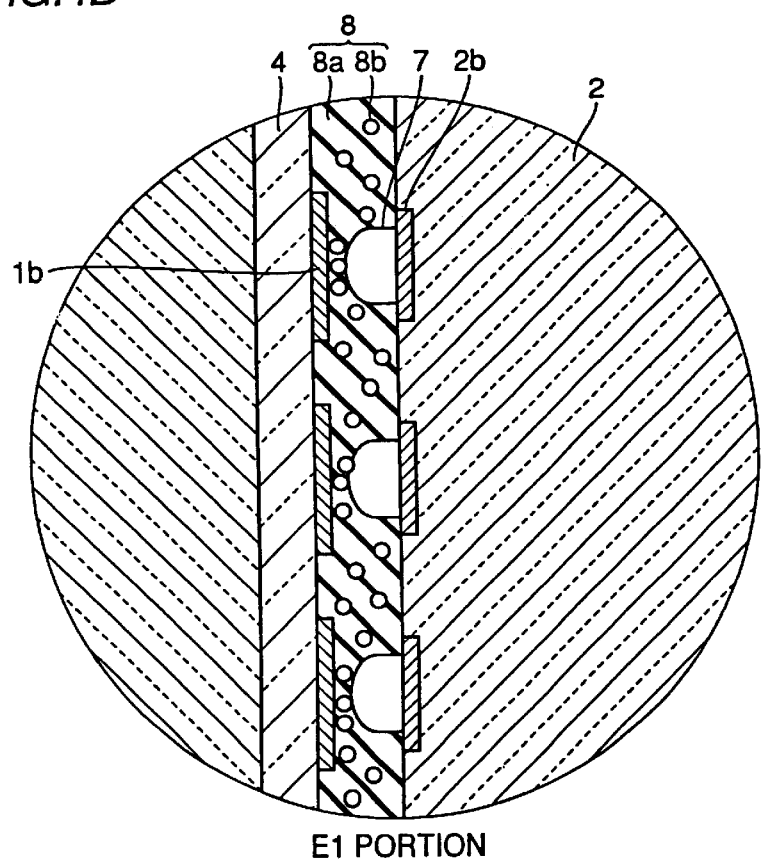
FIG. 4B is an enlarged view of the E1 portion.

FIG. 4A is a cross sectional view showing the image pickup element bonded face down on the film circuit board by FCB. FIG. 4B is an enlarged view of the E1 portion in FIG. 4A. Connecting bump 7 is formed on a respective input/output terminal portion 2b of image pickup element 2. Bump 7 is connected to a respective land portion 1b, being an end of interconnection in the interconnection pattern of film circuit board 1, via one or a plurality of conductive fillers 8b within anisotropic conductive film 8. Land portions 1b are placed on base film 4 together with the interconnections extending continuously from the respective land portions and other interconnections. The insulating layer for prevention of short circuit is not disposed around the land portions. Between land portion 1b of the film circuit board and corresponding bump 7, one or a plurality of granular conductive fillers 8b can be welded with pressure, so that electrical conduction is achieved therebetween. In ACF 8 in the other portions, conductive fillers 8b are distributed within a binder 8a, isolated from each other, thereby maintaining electrical insulation. If conductive filler 8b has a diameter of, e.g., 10 μm or less, neighboring land portions 1b should have spacing therebetween of at least 20 μm to prevent short circuit.

Figure 5A:
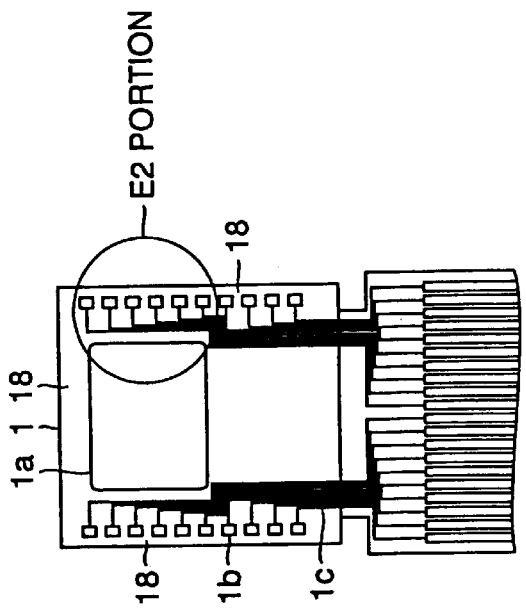
FIG. 5A is a front view of the film circuit board of the first embodiment.
Figure 5B:
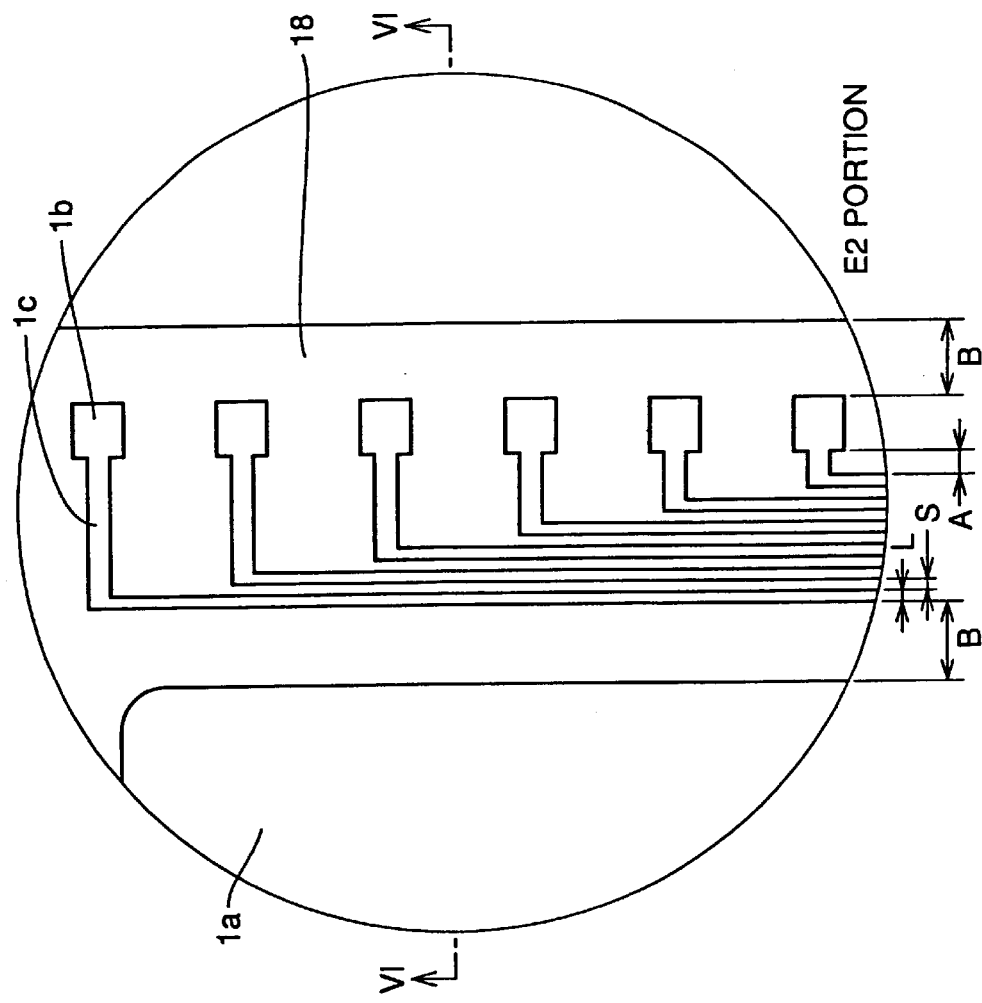
FIG. 5B is an enlarged view of the E2 portion.

FIG. 5A shows the film circuit board, and FIG. 5B shows an enlarged view of the E2 portion in FIG. 5A. The film circuit board has an outer frame portion 18 surrounding opening 1a, and the E2 portion shows a circuit pattern provided in outer frame portion 18 on a lateral side of the opening. The interconnection 1c extends continuously from the land portion 1b as its end portion, along a lateral edge of opening 1a. In FIG. 5B, respective dimensions are defined as follows:

A=a minimum distance from land portion 1b of the film circuit board to a folded portion of interconnection 1c (here, the minimum distance refers to a spacing between the land portion and one of a plurality of interconnections that is located closest to the land portion);

B=a distance from land portion 1b to an outer shape of the film circuit board=a minimum distance from interconnection 1c of the film circuit board to a side of opening 1a (here, the minimum distance refers to a spacing between the side of opening 1a and one of the plurality of interconnections that is located closest to the side of opening 1a);

L=a line width of interconnection 1c; and

S=a spacing between neighboring interconnections.

Specific numerical values of A, B, L and S described above will now be explained. First, dimension B is desirably about 0.3 mm. In the image pickup device of the type employing face-down bonding of the image pickup element on the circuit board, an opening must be provided to the circuit board for receiving light from an imaging lens. Normally, such an opening and an outer shape of a print circuit board are created by blanking, which always causes dimensional spread of a certain range. Thus, in order to avoid any failure in connection between the land portions of the interconnection pattern and the bumps of the image pickup element due to such dimensional distortion, it has conventionally been necessary to keep the minimum distance of at least 0.3 mm from the end of outer shape to the interconnection pattern portion and also keep the minimum distance of at least 0.3 mm from the end of the opening to the interconnection pattern.

Dimension A can be reduced to about 0.1 mm by removing the insulating layer. Normally, for a print circuit board and others, the insulating layer of, e.g., polyimide having an opening corresponding to the land portions is formed to prevent short circuit of the interconnection pattern in portions other than the land portions. Creation of the opening in the insulating layer, however, also causes dimensional distortion. Thus, in order to ensure desired connections between the land portions and the terminal portions of the image pickup element even in the presence of such dimensional distortion, dimensional tolerance of at least 0.3 mm was required between the interconnection pattern and the land portions. That is, A of at least 0.3 mm was necessary. In contrast to such a conventional case, in the present embodiment, it has been confirmed that the land portions and the bumps of the image pickup element can be connected to each other without using the insulating layer, while preventing short circuit in portions other than the land portions, as described above. Thus, dimension A of about 0.1 mm is sufficient, and therefore, when six interconnections are placed in the interconnection portion, the width of the interconnection portion can be narrowed by approximately 0.2 mm. Accordingly, the effect of removal of insulating layer 6 from the mounting region of the image pickup element is not to reduce the thickness thereof; it is rather to narrow the width of the interconnection portion of the circuit board, and hence, the width of outer frame portion 18. This results in reduction in width of the entire circuit board.

Employing today's technique for producing an interconnection pattern, the line width L of interconnection 1c and spacing S between the neighboring interconnections 1c each can be set to about 0.03 mm. Thus, the minimum pitch of each interconnection of 0.06 mm can be realized. Herein, line width L of the interconnection and spacing S between the interconnections are measured in a portion closest to the opening 1a of the film circuit board, as shown in FIG. 5B. These dimensions in the other portions can be made slightly greater, because more margins are afforded for placement of the interconnections therein.

FIGS. 6A and 6B show cross sectional views taken along the line VI—VI in FIG. 5B, without and with ACF 8 and others, respectively. As shown in FIG. 6B, projections like bumps are not provided on the image pickup element corresponding to the portions of the interconnections 1c other than the land portions. Thus, conductive fillers 8b each having a diameter of not greater than 10 μm are distributed within binder 8a, isolated from one another. In the present embodiment, spacing S between the interconnections is at least 0.03 mm (30 μm), as described above, and therefore, short circuit will never occur between the neighboring interconnections due to the conductive fillers. FIG. 6A illustrates line width L of interconnection 1c and spacing S between the interconnections.

Figure 7B:
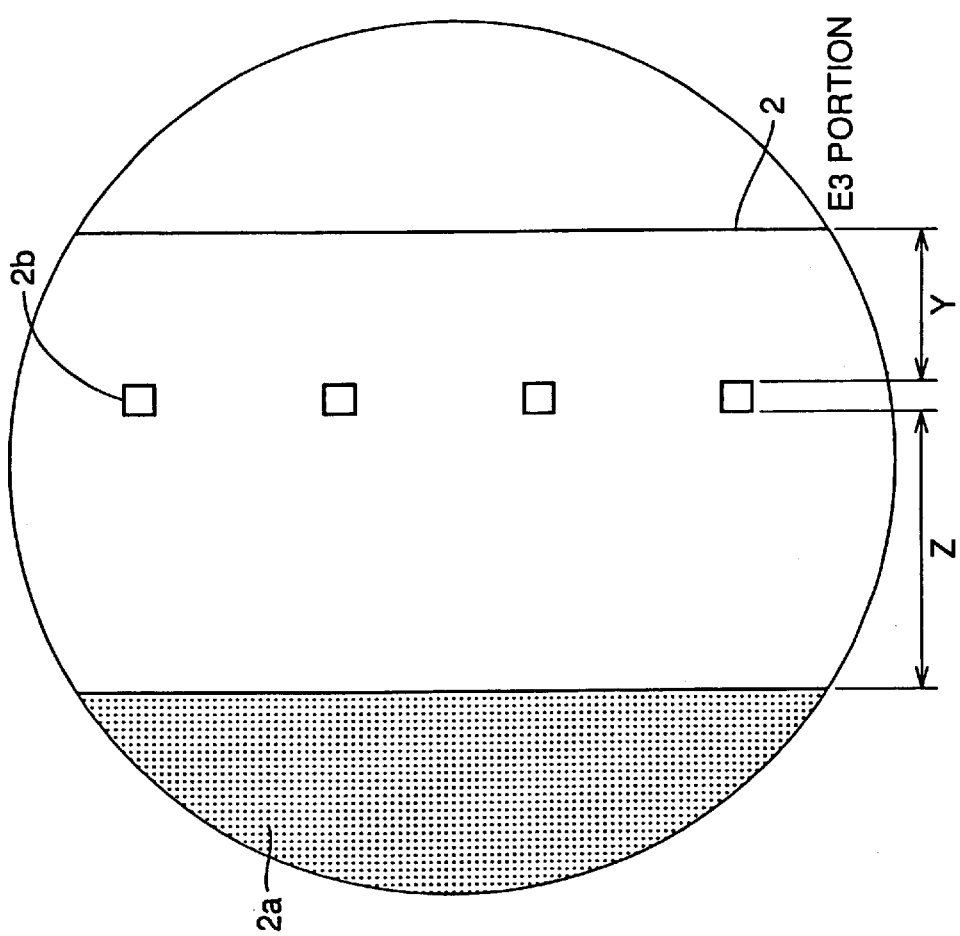
FIG. 7B is an enlarged view of the E3 portion.
Figure 7A:
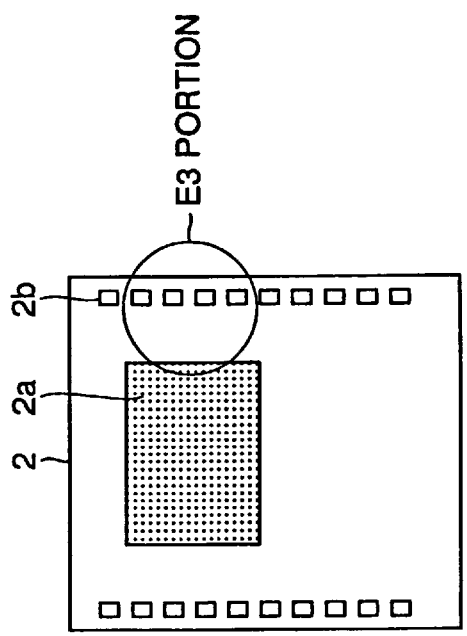
FIG. 7A is a front view of the image pickup element of the first embodiment.

The present embodiment will now be discussed from another standpoint. FIG. 7A is a front view of image pickup element 2, and FIG. 7B is an enlarged view of input/output terminals provided on a lateral side (frame) of the light receiving plate. In order to layout the interconnection pattern of the circuit board corresponding to the periphery of light receiving plate 2a of the image pickup element, the space at the periphery of the opening of the circuit board should be reduced in response to the narrow space at the periphery of the light receiving plate. Assume that all that is desired is to place the image pickup element mounting region of the circuit board within the region of the image pickup element when seen in two dimensions. In this case, dimensions Z (distance from the end of light receiving portion to the input/output terminal of the image pickup element) and Y (distance from the input/output terminal to the outer shape of the image pickup element) shown in FIG. 7B are just made large enough to ensure desired connections under the conditions described above, even in the presence of dimensional distortion due to the blanking. The present invention, however, assigns the highest priority to downsizing, and is designed not to leave any dead space for the purpose of cost reduction. Accordingly, it is attempted to place the image pickup element mounting region of the circuit board within the region of the image pickup element as seen in two dimensions while minimizing the dimensions Z and Y.

In the image pickup device of the first embodiment, six interconnections and corresponding land portions are placed in the lateral side frame of the opening of the film circuit board. The six interconnections are placed along the edge of the opening. Adding up the dimensions A, B and the interconnection pitches described above results in the width of the lateral side frame of the opening of the film circuit board of not greater than 1 mm. Thus, by using such a narrow side frame, it becomes possible to mount the image pickup element face down on the film circuit board, preventing optical information input onto the light receiving plate of the image pickup element from being interfered by the opening provided in the film circuit board.

As explained above, in the image pickup device of the first embodiment, the interconnection pattern on the film circuit board necessary for input/output of electrical signals is placed along the edge of the opening where the land portions are arranged. As a result, it is possible to downsize the image pickup element mounting portion of the circuit board. More specifically, the mounting portion of the circuit board can be made small as seen in two dimensions, so that the portion is included within the region of the image pickup element. Removal of the insulating layer in the mounting portion that has conventionally been deposited to prevent short circuit between the interconnections of the circuit board contributes to this downsizing to a great extent. More specifically, the effect that the minimum distance A between the land portion and the interconnection, which has conventionally been set large enough to allow dimensional distortion of the opening of the insulating layer designed to correspond to the connecting portion, is reduced by approximately 0.2 mm because of the removal of the insulating layer largely contributes to the downsizing.

In the present embodiment, a flexible, film circuit board is utilized. Thus, when mounting the image pickup device on a portable telephone (see FIGS. 20A–20D), it is possible to place the light receiving portion to correspond to the position where light from an imaging lens is received, and to connect terminals of the interface region to a rubber connector 25 within the portable telephone by flexing or undulating the circuit board to afford a certain margin. Accordingly, the degree of freedom in placing the rubber connector 25 within the portable telephone is increased, and further downsizing and weight reduction are enabled.

Figure 20A:
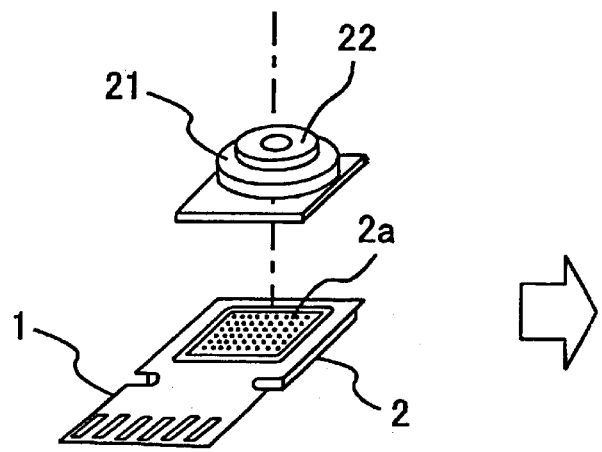
FIG. 20A shows an example of a circuit board and an image pickup device, in which an imaging lens is integrated into a lens unit.
Figure 20B:
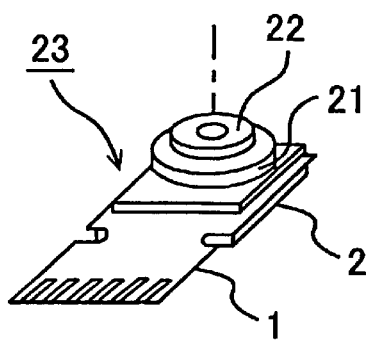
FIG. 20B shows an image pickup device specifically fixed a on circuit board by an adhesive agent.
Figure 20C:
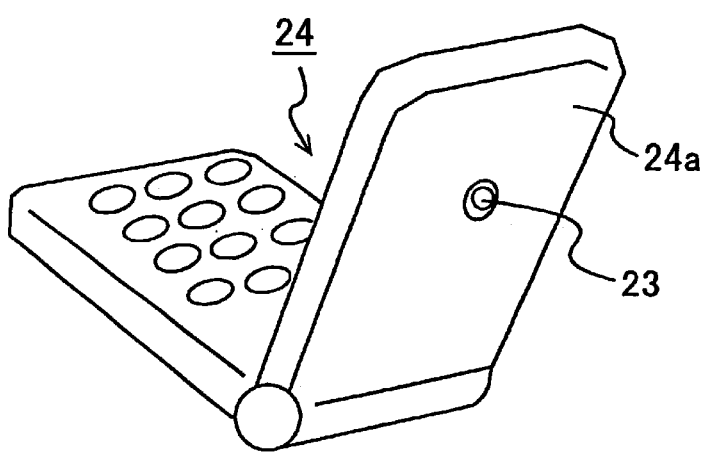
FIG. 20C shows a folder-type portable phone having the image pickup device of FIG. 20B.
Figure 20D:
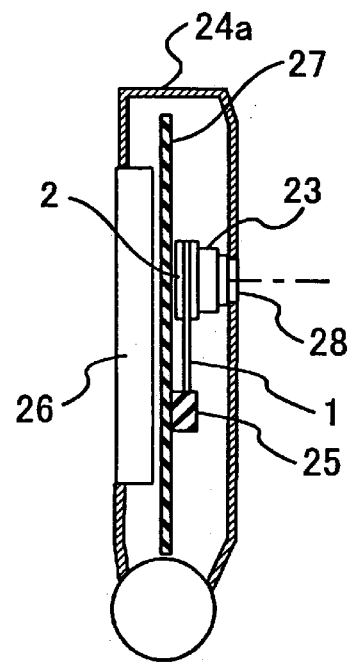
FIG. 20D shows an outline of a cross section of portable phone.

FIG. 20A shows an example of a circuit board 1, in which an imaging lens 22 is integrated into a lens unit 21 and a rubber connector 25 covers the interface region of circuit board 1. FIG. 20B shows an image pickup device 23 that contains lens unit 21. Image pickup device 23 is specifically fixed on circuit board 1 by an adhesive agent, after arranging so that an object image is built on light receiving plane 2a of image pickup element 2 through imaging lens 22. Due to space considerations, the interconnection pattern shown, for example, in FIGS. 1A and 2A, is not illustrated on the circuit board 1 of FIGS. 20A and 20B. FIG. 20C shows a folder-type portable phone 24 having the image pickup device 23 of FIG. 20B. Image pickup device 23 is built into a Liquid Crystal Display (LCD) housing 24a of portable phone 24, being exposed at the surface opposite to the LCD side to face image objects. FIG. 20D shows an outline of a cross-section of LCD housing 24a of portable phone 24. Image pickup device 23 is electrically connected through rubber connector 25 to a second circuit board 27 to which LCD 26 is connected. Image pickup device 23 receives light from an image object through an opening portion 28 situated at LCD housing 24a in the portable phone 24.

In the present embodiment, the circuit pattern interconnections of the film circuit board have been described as routed on a single side. However, such single-sided wiring may be insufficient to accommodate the entire circuit pattern. In such a case, both-sided wiring or multi-layered wiring employing more than two layers may be utilized. Considering the material cost, such wiring may be more expensive compared to the single-sided wiring. However, if downsizing of the image pickup device is given a higher priority, the present embodiment can be applied employing such multi-layered wiring including both-sided wiring. More specifically, by arranging the interconnection pattern of the film circuit board along the edge of the opening therein, and by removing the insulating layer from the image pickup element mounting portion, it is possible to reduce the minimum distance between the land portion and the interconnection. Accordingly, the present embodiment can be applied in any cases of single-sided wiring, both-sided wiring and multi-layered wiring, to promote downsizing of the image pickup device.

Second Embodiment

Figure 8:
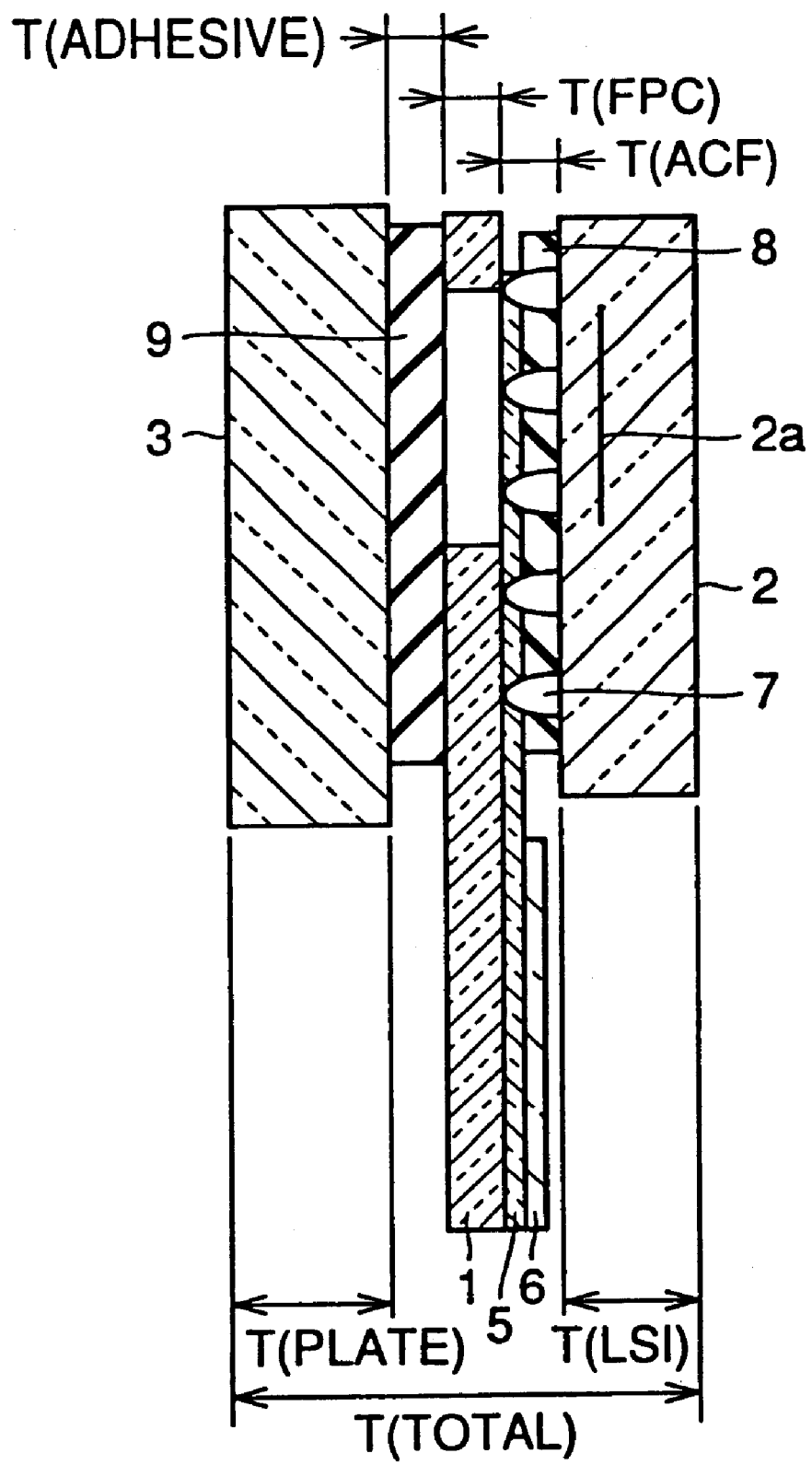
FIG. 8 is a vertical cross sectional view of an image pickup device according to a second embodiment of the present invention.

Referring to FIG. 8 showing the image pickup device according to the second embodiment of the present invention, film circuit board 1 has an opening therein, and transparent plate 3 is fixed on its surface on the side of an imaging lens (not shown) by an adhesive agent 9. Image pickup element 2 is mounted face down on the opposite surface of film circuit board 1, with bumps 7 of the image pickup element being connected to land portions (not shown) of the film circuit board via ACF 8. In FIG. 8, the thickness T (FPC) of film circuit board 1 is set in a range between 0.028 mm and 0.040 mm. Employing FCB, the thickness T (ACF) of ACF 8 connecting film circuit board 1 and image pickup element 2 is restricted within a range between 0.040 mm and 0.050 mm, and the thickness T (LSI) of image pickup element 2 within a range between 0.400 mm and 0.450 mm. Thus, it is possible to control the thickness from the back surface (the rightmost surface in the drawing) of image pickup element 2 to the front surface of the film circuit board not to exceed 0.540 mm.

Further, in FIG. 8, if the thickness T (PLATE) of transparent plate 3 is made at most 0.550 mm, and if the thickness T (ADHESIVE) of the adhesive agent attaching the transparent plate to film circuit board 1 is set in a range between 0.015 mm and 0.020 mm, then the thickness T (TOTAL) from the back surface of image pickup element 2 to the front surface of transparent plate 3 can be made at most 1.110 mm.

Accordingly, in the image pickup device of the second embodiment, T (TOTAL) can be controlled not to exceed 1.20 mm taking into consideration variation in thickness of the adhesive agent. Thus, the image pickup device of low profile can be achieved.

Third Embodiment

Figure 9:
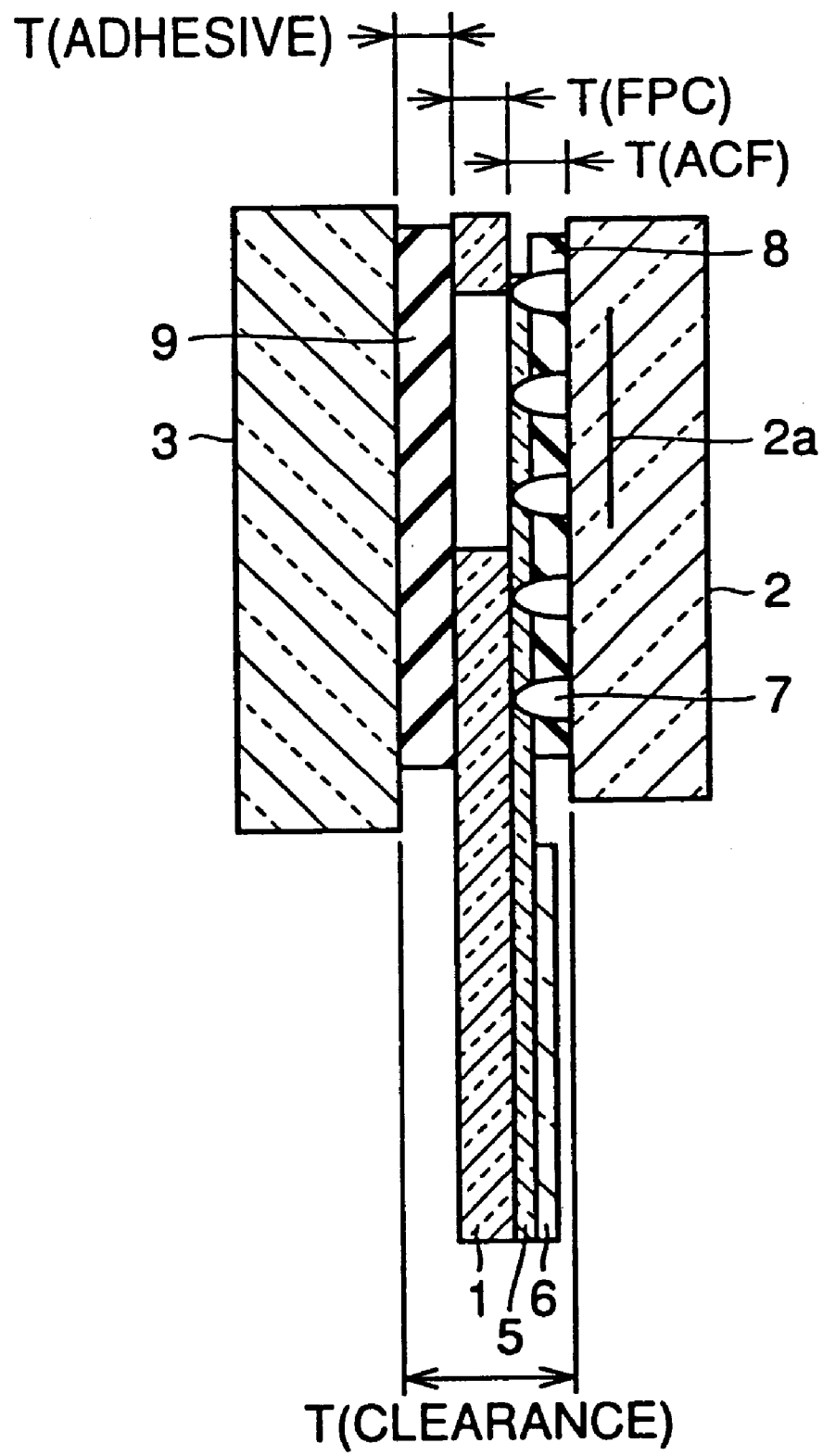
FIG. 9 is a vertical cross sectional view of an image pickup device according to a third embodiment of the present invention.

Referring to FIG. 9, each member of the image pickup device of the present embodiment is the same as in the second embodiment. In the image pickup device of the third embodiment, the height of bumps 7 formed on the input/output terminals of image pickup element 2 is controlled so as to control the thickness of ACF 8. In the present embodiment, variation in height of bumps 7 corresponds to variation in height of ACF 8 after adhesion. The height T (BUMP) of bump 7 (nearly equal to T (ACF)) can be restricted within a range between 0.040 mm and 0.050 mm in this embodiment. Further, since the insulating layer is removed as shown in FIG. 9, variation in thickness of the film circuit board is restricted solely within the range of variation in thickness of base film 4 and conductor layer 5, i.e., between 0.028 mm and 0.040 mm. The thickness of adhesive agent 9 for attachment of transparent plate 3 to the film circuit board can be restricted within a range between 0.015 mm and 0.020 mm. Thus, simply adding up the ranges of the three layers results in a range between 0.083 mm and 0.110 mm. The range of variation with respect to the center value is ±0.0135 mm.

In the image pickup device of the third embodiment, height T (BUMP) of the bump, thickness T (FPC) of the film circuit board and thickness T (ADHESIVE) of the adhesive agent are controlled. Accordingly, it is possible to restrict the variation in the spacing T (CLEARANCE) between the front surface of the image pickup element and the back surface of the transparent plate of the image pickup device not to exceed ±0.015 mm with respect to the center value.

Further, in the image pickup device of the third embodiment, deviation from a parallel relationship parallelism) of the surface of the image pickup element and the transparent plate, which would affect the quality of display upon reproduction, can be restricted within 0.2 degrees.

Fourth Embodiment

Figure 10:
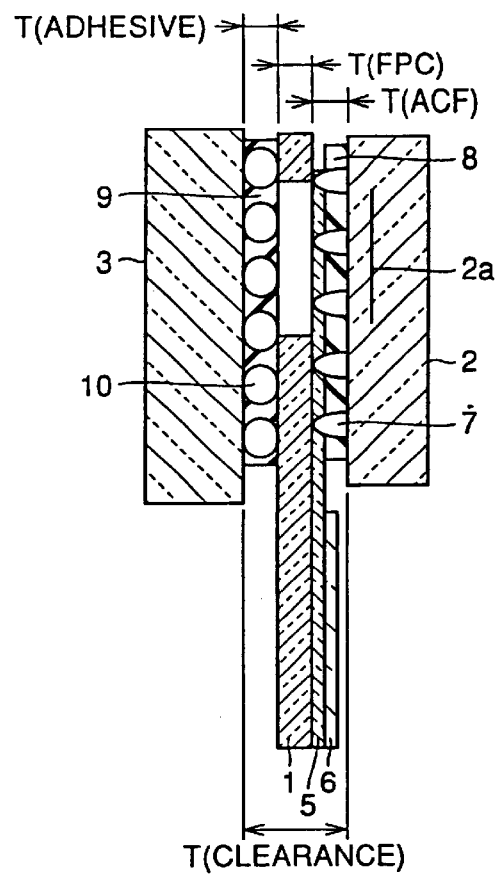
FIG. 10 is a vertical cross sectional view of an image pickup device according to a fourth embodiment of the present invention.

Referring to FIG. 10, in the fourth embodiment of the present invention, film circuit board 1 and transparent plate 3 are connected to each other by adhesive agent 9 including a spacer material 10 of, e.g., plastic bead that is stable in granular diameter. The names of the other members are the same as those in the first through third embodiments denoted by the like reference characters. In an image pickup device of the type having an image pickup element bonded face down to a surface of a film circuit board and a transparent plate placed on the opposite surface of the circuit board, optical defects such as interference fringes will occur. Thus, it is necessary to provide a spacing of at least 0.100 mm between the transparent plate and the light receiving plate 2a of the image pickup element. According to the present embodiment, spacer materials 10 are included in adhesive agent 9 for adhesion of transparent plate 3. Thus, the spacing T (CLEARANCE) between the front surface of image pickup element 2 having light receiving plate 2a and the bottom surface of the transparent plate can be made at least 0.100 mm. Further, it is possible to restrict variation of the spacing T (CLEARANCE), and also restrict deviation from the parallel relationship (parallelism) of the front surface of the image pickup element and the back surface of the transparent plate.

Moreover, an adhesive of the type that is contracted when hardened by heating, or a heat curing adhesive, can be used as adhesive agent 9. This helps improve adhesion strength of transparent plate 3 with respect to film circuit board 1 and image pickup element 2, and stabilize the dimension of spacing T (CLEARANCE) between image pickup element 2 and transparent plate 3.

Fifth Embodiment

Figure 11:
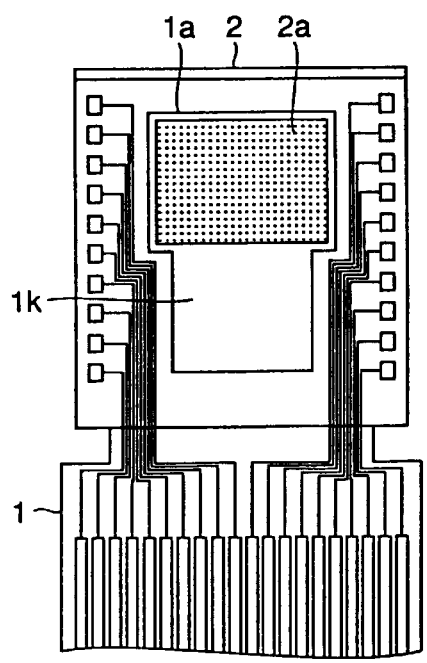
FIG. 11 is a schematic front view of a film circuit board with an image pickup element mounted thereon, according to a fifth embodiment of the present invention.
Figure 12A:
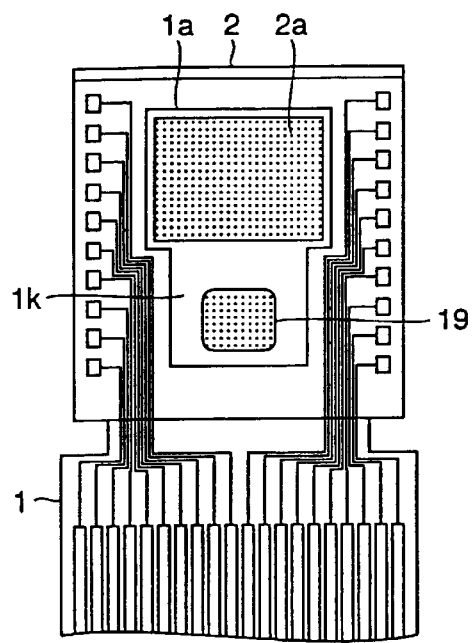
FIG. 12A is a front view of the film circuit board in FIG. 11 with a thixotropic resin placed thereon.
Figure 12B:
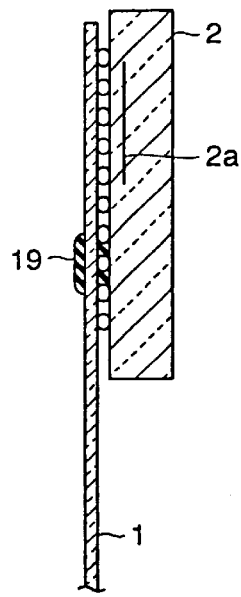
FIG. 12B shows a vertical cross section thereof.
Figure 12C:
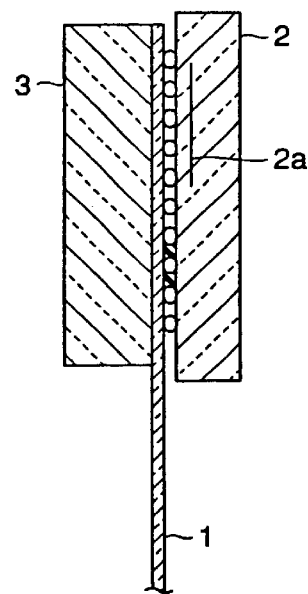
FIG. 12C illustrates a state where the transparent plate is attached to the thixotropic resin.

In the fifth embodiment, a thixotropic liquid adhesive agent of high viscosity is used to keep T (CLEARANCE) in the fourth embodiment at least 0.100 mm. FIG. 11 is a schematic diagram showing a front view of film circuit board 1 according to the present embodiment, with the image pickup element being bonded face down to the back surface thereof. This film circuit board includes, not only the opening 1a provided corresponding to the light receiving plate of the image pickup element, but also a second opening 1k provided continuously under the opening 1a. FIGS. 12A, 12B and 12C show the position where the thixotropic liquid resin 19 is being placed. This thixotropic resin is selected such that it is able to maintain the thickness of at least 0.1 mm after it is placed until hardened. As such, spacing T (CLEARANCE) between the front surface of image pickup element 2 and the bottom surface of the transparent plate can be made at least 0.100 mm either by including the spacer materials within adhesive agent 9 as in the fourth embodiment, or by utilizing the thixotropic resin as in the present embodiment.

Sixth Embodiment

Figure 13:
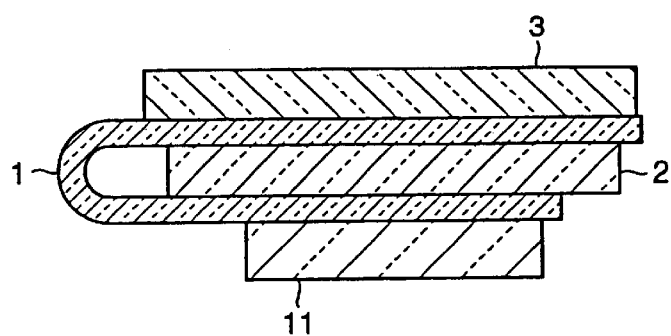
FIG. 13 is a cross sectional view of an image pickup device according to a sixth embodiment of the present invention having a film circuit board with a rubber connector mounted on its front surface, which is folded so that the back surface of film circuit board in the rubber connector mounting region and the back surface of image pickup element are closely contacted with each other.

Referring to FIG. 13, in the sixth embodiment, a rubber connector 11 is mounted in the interface portion on the front surface of film circuit board 1. Film circuit board 1 is loosely folded such that rubber connector 11 is attached via film circuit board 1 to the back surface of image pickup element 2. At the time of mounting the image pickup device on a circuit board of a product, pressure is applied by a holder, for example, so as to closely contact the image pickup device to the circuit board of the product. Image pickup element 2 is configured to be connected to both rubber connector 11 and film circuit board 1 by this pressure. A prescribed length of circuit pattern portion is provided in each of the image pickup element mounting region and the rubber connector mounting region of the film circuit board. As shown in FIG. 13, the film circuit board is configured such that, even if it is folded to make the back surface of the film circuit board in the rubber connector mounting region and the back surface of the image pickup element adhere to each other for integration thereof, only a moderate curve is created, thereby preventing stress from being generated.

Figure 14:
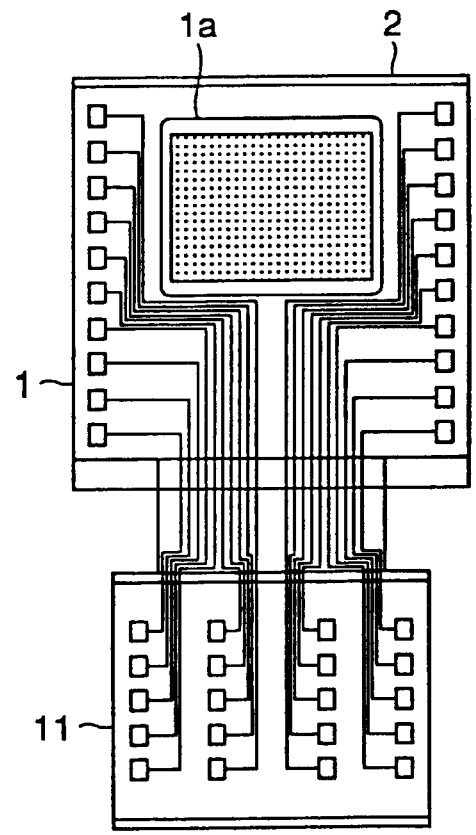
FIG. 14 is a schematic front view of the film circuit board shown in FIG. 13 before being folded.
Figure 15A:
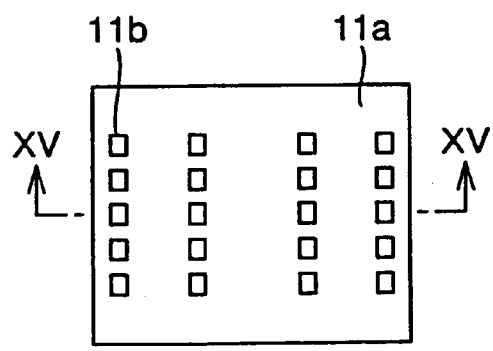
FIG. 15A is a front view of the rubber connector.
Figure 15B:
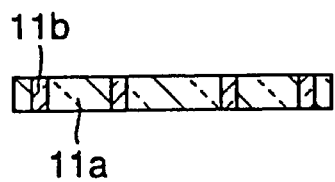
FIG. 15B is a cross sectional view taken along the line XV—XV in FIG. 15A.

The rubber connector itself is mounted on the film circuit board as shown in FIG. 14. FIGS. 15A and 15B show the configuration of rubber connector 11, which achieves electrical connection with the product on which it is mounted when pressure is applied. Referring to FIGS. 15A and 15B, conductive material portions 11b are arranged to correspond to the terminals of the interface portion, and an elastic body 11a of silicone rubber, for example, is filled among the conductive material portions 11b. Such a rubber connector is commercially available from, e.g., Fujipoly Corporation.

According to the present embodiment, when mounting the image pickup device on a circuit board of a product, land portions provided on the film circuit board and the rubber connector are electrically connected by pressure welding, so that a molding connector or the like is unnecessary. Accordingly, reduction in cost as well as in mounting area is enabled, which increases the degree of freedom in designing the film circuit board. Further, elasticity of the rubber connector offers shock-absorbing action when stress is applied to the image pickup element, thereby preventing breakage of the image pickup device.

Seventh Embodiment

Figure 16:
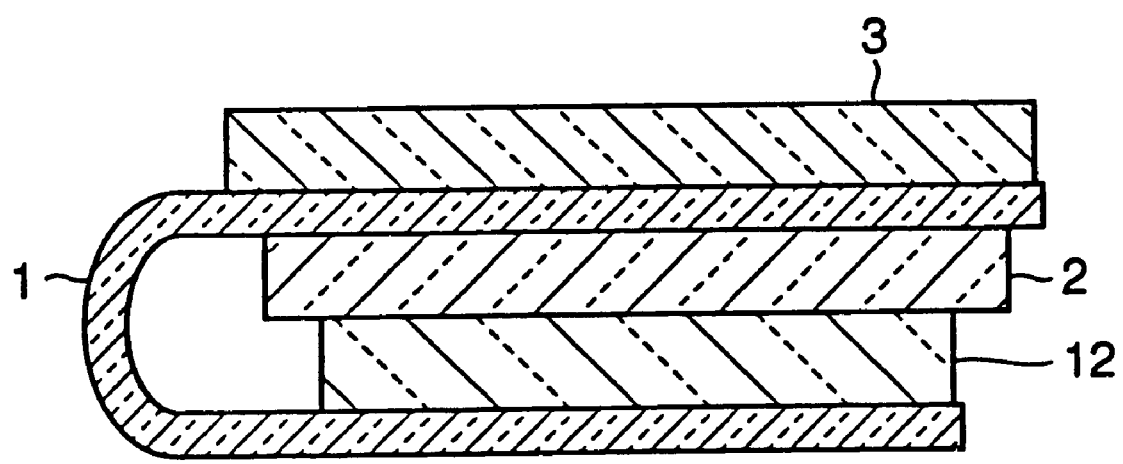
FIG. 16 is a cross sectional view of an image pickup device according to a seventh embodiment of the present invention having a film circuit board with a peripheral circuit element mounted on its back surface, which is folded so that the back surface of peripheral circuit element and the back surface of image pickup element are closely contacted with each other.
Figure 17A:
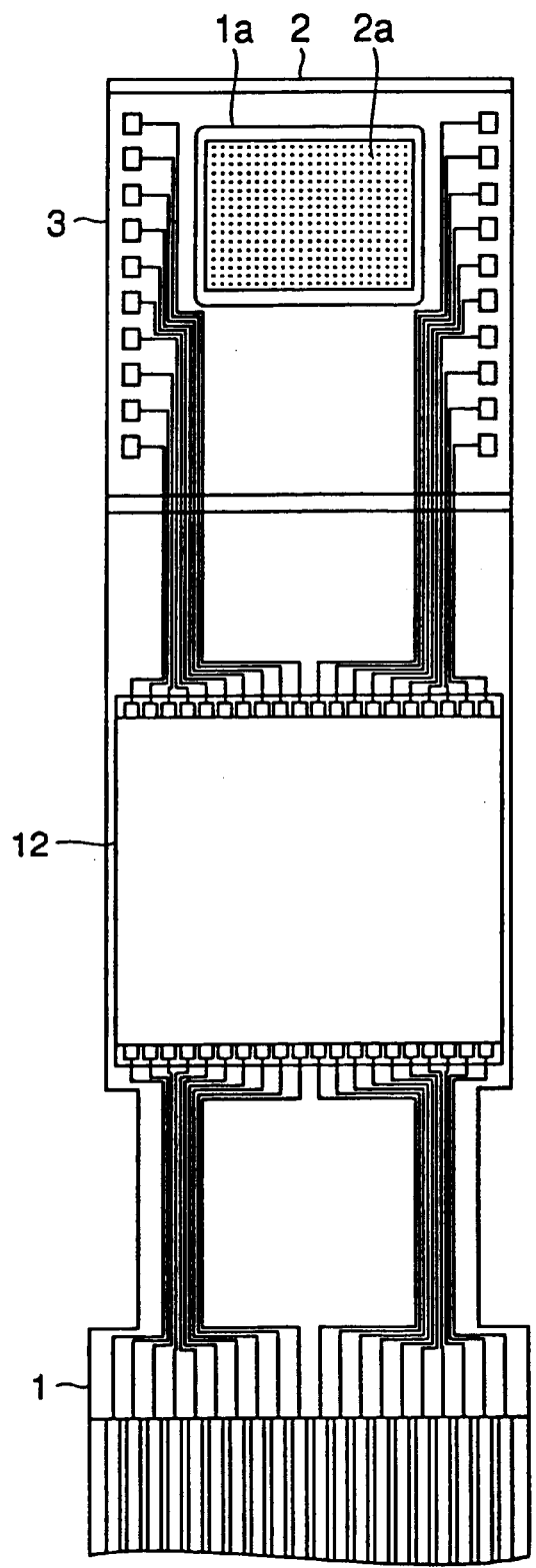
FIG. 17A is a schematic front view of the image pickup device with the peripheral circuit element mounted thereon.
Figure 17B:
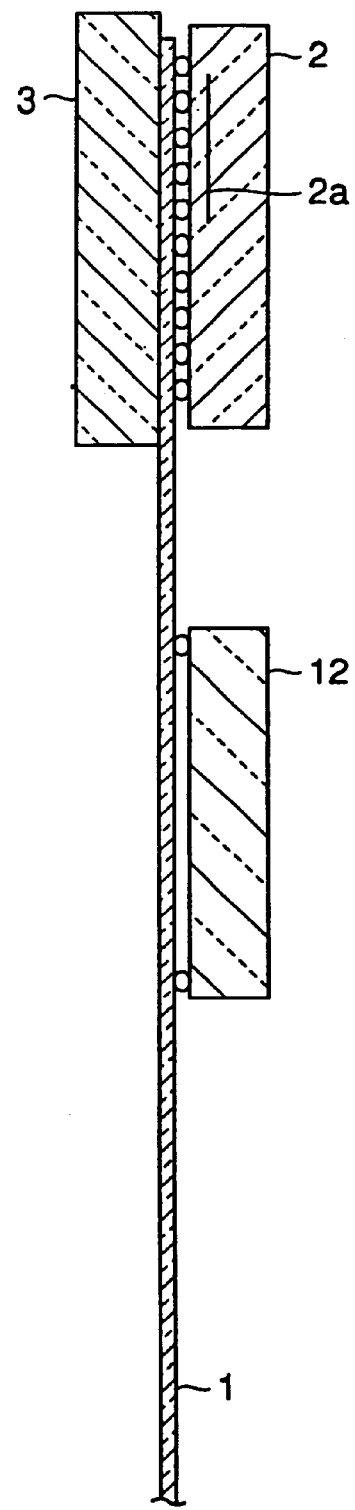
FIG. 17B is a vertical cross sectional view thereof.
Figure 18:
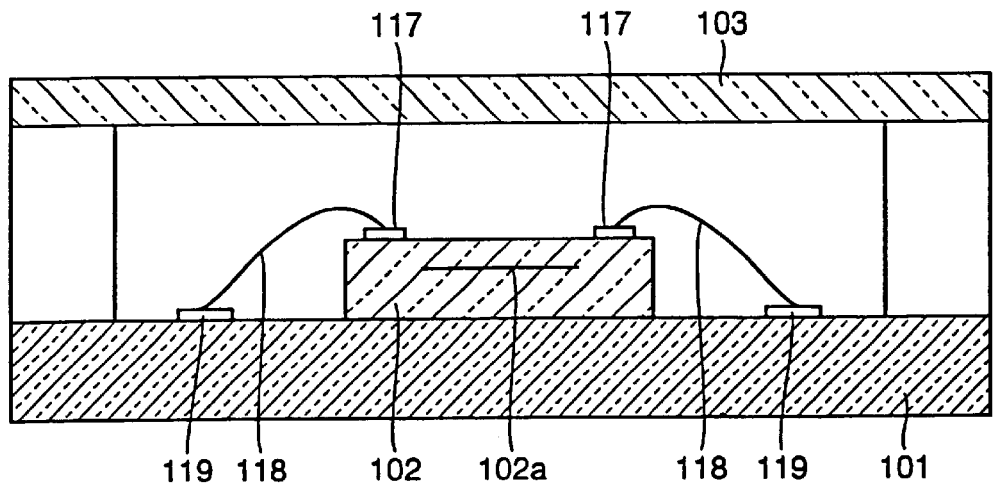
FIG. 18 is a cross sectional view of a conventional image pickup device.
Figure 19A:
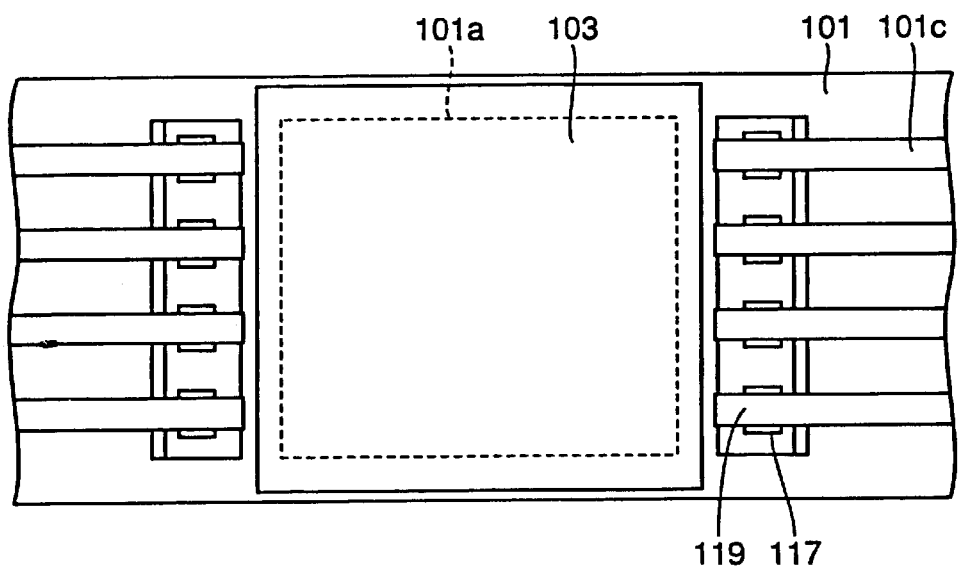
FIG. 19A is a diagram showing another conventional image pickup device.
Figure 19B:
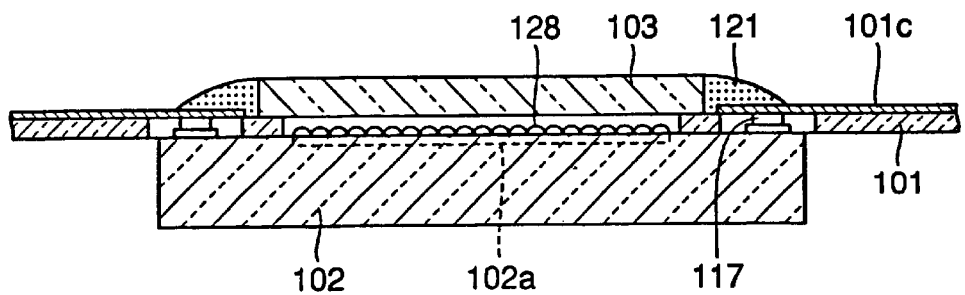
FIG. 19B is a cross sectional view thereof.

Referring to FIG. 16, in the seventh embodiment, an application specific integrated circuit (ASIC) 12 as a peripheral circuit element is mounted on film circuit board 1. The other members of the present embodiment are the same as those in the first through fifth embodiments denoted by the like reference characters. In the image pickup device of the present embodiment, as shown in FIGS. 17A and 17B, peripheral circuit element 12 such as ASIC is mounted face down on the film circuit board on the same side as the image pickup element. The film circuit board is loosely folded such that the back surface of the image pickup element and the back surface of the peripheral circuit element are attached to and integrated with each other. In film circuit board 1, a prescribed length of circuit pattern portion is provided in each of the mounting region of the image pickup element and the mounting region of the peripheral circuit element such as ASIC. Even if the film circuit board is loosely folded, as shown in FIG. 16, to closely contact the back surfaces of image pickup element 2 and peripheral circuit element such as ASIC for integration thereof, only a moderate curve is created, which prevents generation of stress.

According to the present embodiment, in the image pickup device requiring a peripheral circuit element, the image pickup element and the peripheral circuit element can be stacked one on the other as desired, without a need of any special mounting member. Thus, the area of the circuit board of the product being occupied by the image pickup device mounted thereon can be reduced. Note that the rubber connector as in the sixth embodiment can also be used in the interface portion of the image pickup device of the present embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image pickup device, comprising:
   a circuit board provided with an opening portion and having an interconnection pattern formed of a plurality of interconnections and an interface region disposed therein; and
   an image pickup element placed on said circuit board and having a light receiving portion for receiving light from an imaging lens through said opening portion;
   said interconnection pattern being placed in an outer frame portion on a lateral side of said opening portion, together with a plurality of land portions serving as terminals of respective of said plurality of interconnections, and extending to reach said interface region, and at least one of said plurality of interconnections including a portion extending laterally along said lateral side between plural of said land portions and said opening portion.

2. The image pickup device according to claim 1, wherein all of said plurality of interconnections are placed between said plurality of land portions and said opening portion, and said interconnection pattern is placed in said outer frame portion within a region overlapping said image pickup element when seen in two dimensions.

3. The image pickup device according to claim 2, wherein at least one of said plurality of interconnections includes a first portion extending from a respective one of said plurality of land portions towards said opening portion in a direction intersecting an edge of said lateral side of said opening portion, and a second portion extending continuously from an end of the first portion towards said interface region laterally along said lateral side of said opening portion.

4. The image pickup device according to claim 1, further comprising an adhesive agent between said circuit board and said image pickup element for adhesion thereof, the adhesive agent ensuring conduction between one of the plurality of land portions on said circuit board and a corresponding bump on an input/output terminal of said image pickup element and insulation between other portions.

5. The image pickup device according to claim 4, wherein said adhesive agent is an anisotropic conductive film having conductive fillers distributed within a resin as an insulating binder, the conductive filler existing between said one of the plurality of land portions and said corresponding bump in a portion of anisotropic conductive film where said resin is left aside because of adjacency of said one of the plurality of land portions and said corresponding bump realizing conduction between said one of the plurality of land portions and said corresponding bump, and the conductive fillers existing in other portions being distributed within said resin to maintain insulation.

6. The image pickup device according to claim 5, wherein minimum values of (1) a distance between each of the plurality of interconnections, (2) a distance between each of the plurality of land portions, and (3) a distance between each of the plurality of interconnections and each of the plurality of land portions are each at least 0.020 mm, and diameter of said conductive filler in a granular form is less than 0.010 mm.

7. The image pickup device according to claim 1, wherein said circuit board is a flexible, film circuit board.

8. The image pickup device according to claim 1 mounted on a portable telephone such that light from an outside of a casing of said portable telephone passes through said imaging lens and is received at said light receiving portion.

9. The image pickup device according to claim 8, further comprising at least one of a rubber connector and a peripheral circuit element, wherein said circuit board is a flexible, film circuit board, and said film circuit board is folded such that a surface of at least one of said rubber connector and said peripheral circuit element contacts a back surface of said image pickup element directly or indirectly with said film circuit board interposed therebetween.

10. The image pickup device of claim 1, wherein said interface region is arranged on said circuit board on a non-lateral side of said opening portion.

11. An image pickup device, comprising:
a flexible, film circuit board provided with an opening portion and having an interconnection pattern formed of a plurality of interconnections disposed on a back surface side; and
an image pickup element mounted on a back surface side of said film circuit board and having a light receiving portion for receiving light from an imaging lens through said opening portion,
said interconnection pattern being placed in an outer frame portion on a lateral side of said opening portion, together with a plurality of land portions serving as terminals of respective said plurality of interconnections, and at least one of said plurality of interconnections including a portion extending laterally along said lateral side between plural of said land portions and said opening portion.

12. The image pickup device according to claim 11, wherein said opening portion of said film circuit board is sealed by a transparent plate.

13. The image pickup device according to claim 11, wherein a thickness from a back surface of said image pickup element to a front surface of said transparent plate is not greater than 1.20 mm.

14. The image pickup device according to claim 11, wherein said transparent plate is attached to either one of said film circuit board and said image pickup element by adhesive means, the adhesive means having means for setting a distance between said transparent plate and said image pickup element to at least a prescribed value.

15. The image pickup device according to claim 14, wherein a spacer material is included in the adhesive agent attaching said transparent plate to said film circuit board.

16. The image pickup device according to claim 14, wherein said film circuit board is further provided with a second opening portion, and a thixotropic adhesive agent is disposed to penetrate through the second opening portion to attach said transparent plate to said image pickup element.

17. The image pickup device according to claim 11, wherein said film circuit board has a thickness in a range between 0.020 mm and 0.050 mm.

18. An image pickup device comprising an image pickup element mounted on a circuit board having an interconnection pattern formed of a plurality of interconnections disposed therein,
said circuit board having an opening portion and including a first region having an outside size not greater than an outside size of said image pickup element, and a second region having an interface region therein,
said image pickup element being fixed in said first region such that a light receiving plane for receiving light faces said opening portion, and
said interconnection pattern being formed on said first region in an outer frame portion on a lateral side of said opening portion and extending to said second region to electrically connect said image pickup element to the interface region in said second region.

19. The image pickup device according to claim 17, wherein said circuit board includes a plurality of land portions serving as terminals of respective of said plurality of interconnections arranged along a lateral edge of said opening portion, and said interconnection pattern is formed in the outer frame portion on the lateral side of said opening portion in a region between said land portions and said opening portion and extends in a direction along which said plurality of land portions are arranged.

* * * * *

UNITED STATES PATENT AND TRADEMARK OFFICE
CERTIFICATE OF CORRECTION

PATENT NO. : 6,603,107 B2
DATED : August 5, 2003
INVENTOR(S) : Miyake

It is certified that error appears in the above-identified patent and that said Letters Patent is hereby corrected as shown below:

<u>Title page,</u>
Insert Item [63], to read as follows:

-- Related U.S. Application Data

[63] Continuation-in-Part of application No. 09/827,096, filed April 6, 2001. --

<u>Column 1,</u>
Line 3, should read as follows:

-- This application is a Continuation-in-Part of Application Serial No. 09/827,096, filed on April 6, 2001. --

Signed and Sealed this

Sixth Day of January, 2004

JAMES E. ROGAN
*Director of the United States Patent and Trademark Office*